United States Patent [19]

Yamakoshi et al.

[11] Patent Number: 4,825,104
[45] Date of Patent: Apr. 25, 1989

[54] COMPARATOR

[75] Inventors: Akira Yamakoshi; Toyohiko Fujita; Kunihiko Tsukakoshi; Kazuhisa Mito, all of Tokyo, Japan

[73] Assignee: Seikosha Co., Ltd., Tokyo, Japan

[21] Appl. No.: 102,418

[22] Filed: Sep. 29, 1987

[30] Foreign Application Priority Data

Oct. 2, 1986 [JP] Japan ................................ 61-234998
Nov. 10, 1986 [JP] Japan ................................ 61-267072

[51] Int. Cl.$^4$ ............................................. H03K 5/24
[52] U.S. Cl. .................................... 307/355; 307/362; 307/494

[58] Field of Search ............... 307/350, 530, 355, 362, 307/364, 494, 491

[56] References Cited

U.S. PATENT DOCUMENTS 4,563,597 1/1986 Betzold ............................... 307/355

Primary Examiner—John Zazworsky
Attorney, Agent, or Firm—Bruce L. Adams; Van C. Wilks

[57] ABSTRACT

A comparator which sets the comparison level depending on the number of transistors used easily ascertains the relative accuracy of the load resistors, is suitable for integration and improves the relative accuracy of input DC biases.

16 Claims, 2 Drawing Sheets

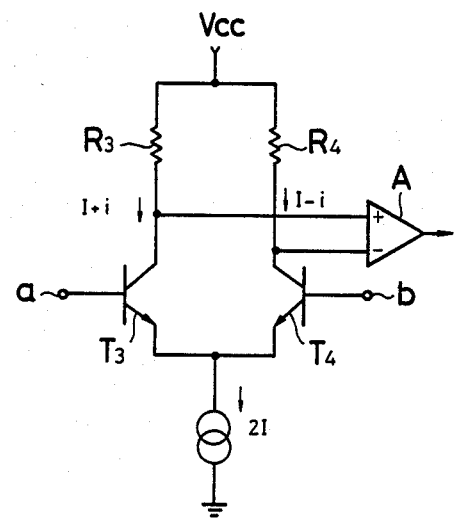

COMPARATOR

BACKGROUND OF THE INVENTION

This invention relates to a comparator.

A conventional comparator generally has a structure such as that shown in FIG. 3 in which a transistor $T_3$ is connected in series with a resistor $R_3$, a transistor $T_4$ is connected in series with a resistor $R_4$, the junction of transistor $T_3$ and resistor $R_3$ and the junction of transistor $T_4$ and resistor $R_4$ are connected to inputs of a differential amplifier A which produces an output corresponding to the difference between the signals supplied to the bases of transistors $T_3$ and $T_4$.

In this arrangement, setting a comparison level is performed by changing a reference potential in the case of a single input while it is performed by changing resistors $R_3$, $R_4$ in the case of a differential input.

The setting of the comparison level in the case of the differential input will now be described. If the difference between the inputs to the bases of transistors $T_3$ and $T_4$ is represented by Vi, and a change in the current is represented by i, currents (I+i), (−i) flow through transistors $T_3$ and $T_4$, respectively, and the respective collector potentials $V_{t1c}$, $V_{t2c}$ are given by $$V_{t1c} = V_{cc} - R_3(I+i)$$

$$V_{t2c} = V_{cc} - R_4(i-i)$$

Since $V_{t1c} = V_{t2c}$, the comparator starts to operate when the comparison level is $$i = I(R_4 - R_3)/(R_3 + R_4)$$

It can be seen from this equation that when, for example, $R_3 = R_4$, the comparator operates with i=0, while when $R_4 = 2 R_3$, the comparator operates with i=I/3. Namely, when $R_4 = 2R_3$, the comparator operates with application of an operating input voltage $v_1$ thereto such that a current i=I/3 flows therethrough.

A drawback in the above circuit arrangement is that when the comparison level is set with a reference voltage, the reference voltage and an input potential to be compared must be of high accuracy.

In the case of a differential input, as described above, the comparison level is determined by $(R_4 - R_3)/(R_3 + R_4)$, so that disadvantageously the relative accuracy of the resistors is required. Especially, when the resistances of resistors $R_3$ and $R_4$ are different, integration is difficult.

BRIEF DESCRIPTION OF THE DRAWINGS

FIG. 3 is an electric circuit diagram showing a conventional comparator.

DETAILED DESCRIPTION OF THE PREFERRED EMBODIMENT

Figure 1:
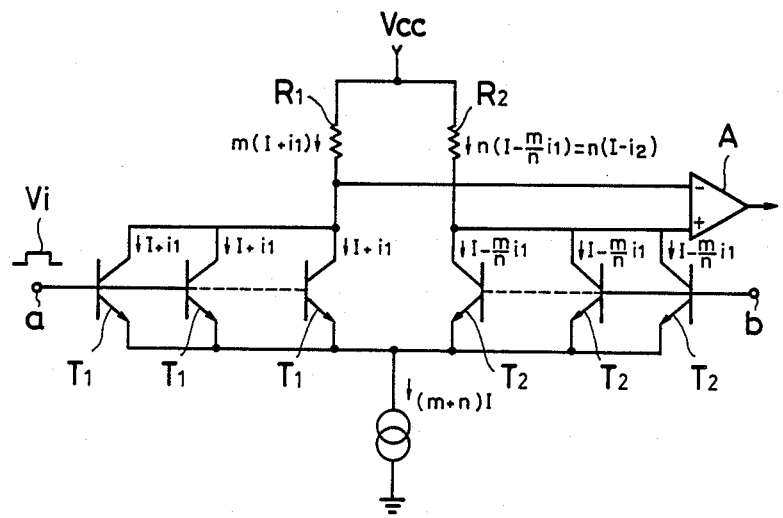
FIG. 1 is an electric circuit diagram showing one embodiment of this invention.

In FIG. 1, m(m=1, 2 ...) transistors $T_1 \sim T_1$ are connected in parallel and an input terminal a is connected to the respective bases of the transistors. A load resistor $R_1$ is connected in series with that circuit. Also, n(n=1, 2 ... but n≠m) transistors $T_2 \sim T_2$ are connected in parallel and an input terminal b is connected to the respective bases of the transistors. A load resistor $R_2$ is also connected in series with this circuit. The resistors $R_1$ and $R_2$ have the same resistance so as to facilitate integration. The junction of resistor $R_1$ and transistors $T_1 \sim T_1$ and the junction of resistor $R_2$ and transistors $T_2 \sim T_2$ are connected to input terminals of a differential amplifier circuit A.

When a voltage $v_i$ is applied across input terminals a, b, assume that a change current i flows through each transistor and that a bias current (m+n)I flows. A current (I+$i_1$) flows through each transistor $T_1$ while a current (I−$i_2$) flows through each transistor $T_2$. Since $$m(I+i_1) + n(I-i_2) = (m+n)I$$

$$i_2 = (m/n)i_1$$

If collector voltages of transistors $T_1$ and $T_2$ are shown by $V_{cm}$, $V_{cn}$, $$V_{cm} = V_{cc} - R\ m(I+i_1)$$

$$V_{cn} = V_{cc} - R\ n(I-(m/n)i_1)$$

Since $V_{cm} = V_{cn}$, the comparison level is given by $$i_1 = (n-m)I/2m$$

As just described, the comparison level is set by the number of transistors $T_1$ and $T_2$. For example, when n=2, then comparison is performed with m=1, and $i_1 = I/2$, and $i_2 = I/4$.

According to the above arrangement, the load resistors $R_1$ and $R_2$ can be arranged to have the same value to set the comparison level. Therefore, the relative accuracy of the load resistors is easy to obtain and the structure is suitable for integration.

Now another embodiment will be described.

Figure 2:
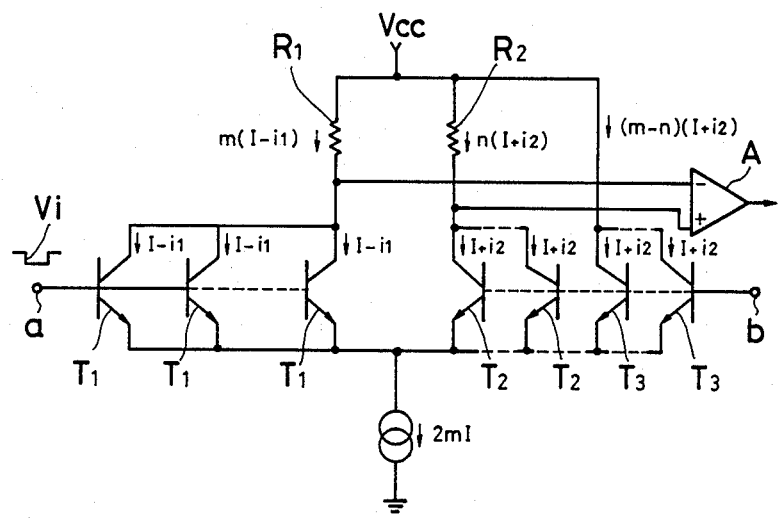
FIG. 2 is an electric circuit diagram showing another embodiment.

In FIG. 2, a first circuit includes m(m=1, 2 ...) transistors $T_1 \sim T_1$ connected in parallel with each other with an input terminal a being connected to the respective bases of the transistors. A first load resistor $R_1$ is connected in series with this circuit. A second circuit includes n(n=1, 2 ..., with n≠m) transistors $T_2$ with an input terminal b being connected to the respective bases of the transistors. A second load resistor $R_2$ is connected in series with this circuit. The resistors $R_1$ and $R_2$ have the same resistance so as to render integration easy. The junction of resistor $R_1$ and transistor $T_1$ and the junction of resistor $R_2$ and transistor $T_2$ are connected to input terminals of a differential amplifier circuit A. In addition to the above circuit structure, (m−n) transistors $T_3$ with an input terminal b being connected to the respective bases of the transistors are connected in parallel with resistor $R_2$ and the second circuit.

When voltage $v_i$ is applied across input terminals a and b, a current (I−$i_1$) flows through each transistor $T_1$ and a current (I+$i_2$) flows through each of transistors $T_2$ and $T_3$ where $i_1$ and $i_2$ are change currents flowing through transistors $T_1$ and $T_2$, respectively, 2mI is the bias current. The following relationship holds from the quality of the operational amplifier circuit $$m(I-i_1) + n(I+i_2) + (m-n)(I+i_2)$$

$$= 2mI$$

Therefore, $i_2 = i_1$. If collector voltages of transistors $T_1$ and $T_2$ are shown by $V_{cm}$, $V_{cn}$, respectively, then $$V_{cm} = V_{cc} - R\ m(I - i_1)$$

$$V_{cn} = V_{cc} - R\ n(I + i_1)$$

Since $V_{cm} = V_{cn}$, the comparison level is given by $$i_1 = (m-n)I/(m+n)$$

In this embodiment, the comparison level is set depending on the number of transistors $T_1$, $T_2$ and $T_3$. For example, when $m=2$, $n=1$, the comparison is performed with $i_1 = I/3$.

According to the above structure, the load resistors $R_1$ and $R_2$ can have the same value and the comparison level can be set, so that the relative accuracy of the load resistors is easy to obtain, and the structure is suitable for integration. In addition, the input DC levels can have the same voltage to determine the comparison level, so that the relative accuracy of input DC biases is easy to obtain.

According to this invention, the comparison level can be set depending on the number of transistors used, so that the load resistors can have the same value, the relative accuracy of resistors is easy to obtain and the structure is suitable for integration. Since the input DC biases can have the same voltage, the relative accuracy of biases is improved. In addition, quantities (absolute values) of changes in the collector currents to the input voltages, and bias currents in the respective transistors are the same, so that setting the respective comparison levels is easy.

We claim:

1. A comparator comprising:
   a first circuit including $m(m=1, 2 \ldots)$ transistors connected in parallel for receiving a first input signal at each respective base of the transistors;
   a second circuit including $n(n=1, 2 \ldots$ where $n \neq m)$ transistors connected in parallel for receiving a second input signal at each respective base of the transistors;
   a first load resistor connected in series with the first circuit, and a second load resistor having the same resistance as the first load resistor and connected in series with the second circuit;
   said first circuit and said first load resistor constituting a first series-connected circuit, and said second circuit and said second load resistor consituting a second series-connected circuit, said first series-connected circuit and said second series-connected circuit each being connected in parallel with a common power source; and
   a differential amplifier having input terminals respectively connected to a junction of the first load resistor and the first circuit and a junction of the second load resistor and the second circuit.

2. The comparator of claim 1; wherein each of said transistors of said first circuit is of the same type connected with the same orientation.

3. The comparator of claim 1; wherein each of said transistors of said second circuit is of the same type connected with the same orientation.

4. The comparator of claim 1; wherein each of said transistors of said first and second circuits is of the same type connected with the same orientation.

5. The comparator of claim 1; wherein each transistor is connected to said differential amplifier.

6. The comparator of claim 1; wherein each transistor of said first circuit is connected to a first terminal of said differential amplifier and each transistor of said second circuit is connected to a second terminal of said differential amplifier.

7. The comparator of claim 6; wherein the collectors of each transistor of said first circuit are connected to said first terminal.

8. The comparator of claim 6; wherein the collectors of each transistor of said second circuit are connected to said second terminal.

9. A comparator comprising:
   a first circuit including $m(m=2, 3 \ldots)$ transistors connected in parallel for receiving a first input signal at each respective base of the transistors;
   a second circuit including $n(n=1, 2 \ldots$ where $n<m)$ transistors connected in parallel for receiving a second input signal at each respective base of the transistors;
   a third circuit including $(m-n)$ transistors connected in parallel and receiving the second input signal at each respective base of the transistors;
   a first load resistor through which the first circuit is connected to a power source, and a second load resistor having the same resistance as the first load resistor and through which the second circuit is connected to the power source;
   said third circuit connected in parallel with a series-connected circuit including the second load resistor and the second circuit; and
   a differential amplifier having input terminals respectively connected to a junction of the first load resistor and the first circuit and a junction of the second load resistor and the second circuit.

10. The comparator of claim 9; wherein each of said transistors of said first circuit is of the same type connected with the same orientation.

11. The comparator of claim 9; wherein each of said transistors of said second circuit is of the same type connected with the same orientation.

12. The comparator of claim 9; wherein each of said transistors of said first and second circuits is of the same type connected with the same orientation.

13. The comparator of claim 9; wherein each transistor is connected to said differential amplifier.

14. The comparator of claim 9; wherein each transistor of said first circuit is connected to a first terminal of said differential amplifier and each transistor of said second circuit is connected to a second terminal of said differential amplifier.

15. The comparator of claim 9; wherein the collectors of each transistor of said first circuit are connected to said first terminal.

16. The comparator of claim 9; wherein the collectors of each transistor of said second circuit are connected to said second terminal.

* * * * *